United States Patent [19]

Ishikawa et al.

[11] Patent Number: 5,352,248
[45] Date of Patent: Oct. 4, 1994

[54] PYROMETER TEMPERATURE MEASUREMENT OF PLURAL WAFERS STACKED ON A PROCESSING CHAMBER

[75] Inventors: Hiroichi Ishikawa, Mahwah, N.J.; Michael S. Kolesa, Norwalk, Conn.

[73] Assignee: Materials Research Corporation, Orangeburg, N.Y.

[21] Appl. No.: 869,465

[22] Filed: Apr. 15, 1992

Related U.S. Application Data

[63] Continuation-in-part of Ser. No. 701,800, May 17, 1991, Pat. No. 5,259,881.

[51] Int. Cl.⁵ .................. H01L 21/00; H01L 21/02; H01L 21/306
[52] U.S. Cl. ...................... 29/25.01; 156/626
[58] Field of Search ................ 29/25.01; 156/626

[56] References Cited

U.S. PATENT DOCUMENTS

| | | | |
|---|---|---|---|
| 2,690,078 | 9/1954 | Phillips, Jr. | 374/129 |
| 4,020,695 | 5/1977 | Roney | 374/127 |
| 4,435,093 | 3/1984 | Krause et al. | 250/346 |
| 4,452,538 | 6/1984 | Reger et al. | 250/347 |
| 4,649,261 | 3/1987 | Sheets | 118/50.1 |
| 4,657,386 | 4/1987 | Suarez-Gonzalez et al. | 374/127 |
| 4,666,297 | 5/1987 | Suarez-Gonzalez | 374/127 |
| 4,708,474 | 11/1987 | Suarez-Gonzalez | 374/127 |
| 4,797,006 | 1/1989 | Masom | 374/130 |
| 4,799,787 | 1/1989 | Mason | 356/43 |
| 4,823,291 | 4/1989 | Berman | 364/557 |
| 4,919,542 | 4/1990 | Nulman et al. | 374/9 |
| 4,924,478 | 5/1990 | Tank | 374/121 |
| 4,969,748 | 11/1990 | Crowley et al. | 374/128 |
| 4,979,134 | 12/1990 | Arima et al. | 364/557 |
| 4,984,902 | 1/1991 | Crowley et al. | 374/126 |
| 5,061,084 | 10/1991 | Thompson et al. | 374/127 |
| 5,156,461 | 10/1992 | Moslehi et al. | 374/137 |

OTHER PUBLICATIONS

Watanabe, T. et al., "Radiation Thermometry of Silicon Wafers in a Diffusion Furnace for Fabrication of LSI", IEE Transactions Transactions on Semiconductor Manufacturing, Feb., 1991.

*Primary Examiner*—R. Bruce Breneman
*Assistant Examiner*—B. Everhart
*Attorney, Agent, or Firm*—Wood, Herron & Evans

[57] ABSTRACT

A method of measuring and controlling the temperature of articles stacked in parallel in a chamber. A pyrometer is positioned outside of a chamber and directed, either directly or with mirrors, through a window in the chamber wall so that only energy from wafers removed from the ends of the stack is received by the pyrometer. The pyrometer is inclined at an angle so that substantially all energy from the opposite side of the stack and reflected through spaces between facing parallel pairs of wafer surfaces will have been reflected a large number of times by the wafers before entering the pyrometer. Thus, regardless of the emissivity or transmissivity of the wafers, the energy incident upon the pyrometer will approach that emitted by a black body of the same temperature as the wafers, and the temperature read by the pyrometer will be independent of the emissivity or transmissivity of the wafers.

9 Claims, 2 Drawing Sheets

PYROMETER TEMPERATURE MEASUREMENT OF PLURAL WAFERS STACKED ON A PROCESSING CHAMBER

This is a continuation-in-part of U.S. Pat. application Ser. No. 07/701,800, filed May 17, 1991 entitled Wafer Processing Cluster Tool Batch Preheating and Degassing Method and Apparatus now U.S. Pat. No. 5,259,881.

FIELD OF THE INVENTION

The present invention relates to the temperature measurement of thin flat articles such as semiconductor wafers, and particularly, to the measurement of the temperature of pluralities of such articles stacked in racks in processing chambers such as those of semiconductor wafer processing machines. More particularly, the present invention relates to pyrometer temperature measurement techniques useful during batch thermal processes such as those performed in semiconductor wafer processing machines, for example, in batch preheating or degassing modules of a semiconductor wafer processing cluster tools.

BACKGROUND OF THE INVENTION

Semiconductor wafers are subjected to a variety of processing steps in the course of the manufacture of semiconductor devices. The processing steps are usually carried out in sealed vacuum chambers of wafer processing machines. Most of the processes performed on the wafers require the monitoring and control of the temperature of the wafers during processing, and certain of these processes, such as degassing and annealing processes, have the heat treating of the wafers as their essential process step. In several of such processes, particularly the essentially thermal treatment processes, a plurality of wafers may be stacked in a rack within a chamber of the processing machine and simultaneously processed as a batch.

A variety of temperature sensing techniques are employed in the various semiconductor wafer treating processes to monitor the temperature of the wafers and often also to control the wafer heating or cooling elements. Thermocouple devices, for example, are frequently employed, particularly when a wafer is being treated while held in thermal contact with a temperature controlled wafer support. In such cases, the thermocouple is often maintained in contact with the support, and thus only indirectly measures the temperature of the wafer on the support. In certain other situations, thermocouple devices, are brought in direct contact with the wafer. Such positioning of the thermocouples may expose the sensors to heat directly from the wafer heating source, such as where radiant energy is used to heat the wafer, or may, by direct contact with the wafer, contribute to undesirable wafer contamination.

Techniques have also been proposed for deriving wafer temperature indirectly by measuring the thermal expansion of the wafer. Such techniques present a disadvantage in that such measurements yield a reading proportional to temperature difference. Accordingly, initial wafer temperature must be known and a wafer dimension must first be measured at the known initial temperature before the monitored temperature can be derived. Furthermore, such techniques can be effective to read the temperature of a single wafer, but these techniques are difficult to apply where a plurality of wafers, particularly closely spaced wafers, are processed and the temperature of the wafer batch must be read.

In many wafer processing machines, pyrometers are employed to measure the temperature of wafers being processed within. These pyrometers measure the emissive power of heated objects such as the wafers. This emissive power, however, varies with the emissivity of the object, which, for some materials, varies with temperature. The emissivity particularly varies with the materials of which the object is made and of the coatings which have been applied to the object. In semiconductor wafer processing, there are many kinds of coatings that may be found on the wafers. These coatings vary with the processes used on the wafer. Accordingly, for a pyrometer to be used accurately to measure the temperature of such a coated wafer, an initial measurement to determine the emissivity of the object is frequently required.

As a result of the problems with pyrometers, a number of schemes to measure wafer temperature in semiconductor wafer processes have been devised that either measure the emissivity of the object or apply some sort of a correction to the pyrometer output. Often a pyrometric temperature is measured of an object of known emissivity mounted in the chamber and known to be at the same temperature as the wafer being measured. Often also, a measurement is made with a reference pyrometric sensor to generate data that is then used to correct the temperature reading from a primary parametric sensor to account for the emissivity of the wafer being measured.

Measurement of wafer temperature from the backside of a wafer may reduce the effect of the emissivity changes due to the coatings on the front side of the wafer, but an initial problem is encountered in that the uniformity of the backside of the wafer is not precisely controlled, and may vary from wafer to wafer.

Accordingly, there remains a problem of accurately measuring the temperature of semiconductor wafers or similar thin flat articles during processing in semiconductor wafer processing machines. Particularly, there is a need for measuring, without contact with the wafer, the temperature of wafers, particularly where they are being thermally processed in batches and may be closely spaced in a stack within the processing chamber.

SUMMARY OF THE INVENTION

It is a primary objective of the present invention to provide an accurate noncontact measurement of the temperature of thin flat articles, such as semiconductor wafers, in a processing chamber of a processing apparatus, and particularly to measure the temperature of such articles during processing in a batch and with the articles arranged in a stack.

It is a particular objective of the present invention to provide a pyrometer temperature measurement technique that will accurately measure the temperature of semiconductor wafers in a chamber of a semiconductor wafer processing apparatus, and that will measure the temperature accurately independent of the emissivity of the wafers or the coatings thereon.

According to the principles of the present invention, a pyrometer is provided to measure the emitted thermal radiation from a stack of articles, particularly semiconductor wafers, being processed in a chamber of a processing apparatus, by viewing the articles from the side of the stack at an angle to their surfaces. In the preferred embodiment of the invention, a directional pyrometer is inclined toward the backsides of the wafers in a stack, so that one or a plurality of the wafers located in a central portion of the stack are viewed by the pyrometer. Thermal energy received by the pyrometer is restricted to the centrally located wafers by the directional characteristics of the pyrometer, which has a limited field-of-view around the axis or line-of-site of the pyrometer.

In the preferred embodiment of the present invention, the pyrometer is provided outside a processing chamber of a wafer processing apparatus, such as a batch preheating degas module of a semiconductor wafer processing cluster tool, in which the plurality of wafers are arranged in a stack for batch pretreatment. The pyrometer is aimed through a window in the wall of the processing chamber, either in a direct linear path or in one directed by mirrors, at the side of the stack of wafers. The wafers are usually circular, and their circular edges define a surface of a cylinder, which may be considered a boundary of disc-like spaces between the parallel wafers. The pyrometer is responsive to thermal energy of some wavelength, usually in the infrared band, and the window is made of a material, such as barium fluoride, that transmits energy of this wavelength.

In accordance with this preferred embodiment, the pyrometer is inclined at an angle which is sufficient, with respect to the wafers of a given diameter and spacing, to ensure that the energy that is not directly emitted from or transmitted through the wafers, but is incident upon the pyrometer, will have encountered a plurality of reflections, preferably at least eight (8) reflections, from the opposed facing surfaces of, and along the space between, the parallel spaced wafers of the batch. Where there are highly reflective coatings on one side of the wafer, the number of reflections is preferably at least fourteen (14), and with reflective coatings on both sides of the wafers, the number of reflections is preferably at least twenty (20).

In addition, the wafers viewed by the pyrometer are preferably removed by at least one wafer from the ends of the stack, and with highly transmissive wafers, by several wafers from the ends of the stack, so that equal amounts of energy are transmitted in both directions through the wafers adjacent to spaces that are within the field of view of the pyrometer. With the wafers viewed by the pyrometer being one or preferably more wafers removed from the end wafer of the stack, the energy transmitted through the wafer, if any, is approximately equal to and cancelled by the energy transmitted through the wafer from the opposite side, since that transmitted energy originates from another wafer of the same temperature. As a result, the power received by the pyrometer approximates that radiated from black body that is at the same temperature as the wafers.

The pyrometer of the device of the present invention is preferably configured to view from the side of the stack and the backsides of the wafers, for example, from the bottom of upwardly facing wafers of a stack. Thus, the backsides of one or more wafers and the spaces therebetween are in the view of the pyrometer. The angle of the pyrometer to the planes of the wafers of the stack is equal to or greater than the minimum angle required to ensure that a large number of reflections from parallel wafer surfaces will be encountered by light reflected through the stack to the pyrometer at any angle within its field of view. This angle is a function of geometric parameters that include the diameter and spacing of the wafers. The larger the diameter of the wafers and the closer the spacing of the wafers, the shallower the angle may be. It is important that the angle not be so shallow that energy may pass on a straight line from the chamber or chamber wall on the opposite side of the wafer, or pass with too few reflections, say two (2) or four (4) reflections, before it enters the pyrometer.

The maximum angle of the direction of the pyrometer toward the backside surfaces of the wafers should also not be too great, or the shadowing of one wafer by the edge of another and reflections from wafer edges, which may not be perfectly aligned in the stack, may confuse the pyrometer reading. Ideally, the field-of-view of the pyrometer would be small so that a minimum percentage of wafer edge, is in the field-of-view.

Accordingly, embodied in a degas chamber of a semiconductor wafer processing cluster tool, in which a plurality of wafers, 150 or 200 or more millimeters in diameter, 0.75 millimeters in thickness, approximately 25 in number arranged in a stack and spaced approximately 9 millimeters apart, the preferred angle of direction of a pyrometer is about 40°, for a pyrometer with a 7° or less field of view.

With the present invention, it has been found that, with the angle of a pyrometer aimed at the boundaries of the spaces between the center three wafers of a stack of five or more parallel wafers in a degas processing chamber of a wafer processing apparatus, the energy received by the pyrometer exceeds approximately 98% of that received from a black body.

With bare silicon wafers, the emissivity of the wafers is approximately 0.4. With such wafers, and with the net transmissivity of these centrally positioned wafers being zero, the reflectivity is 60%, and the energy received will be even closer to that of a black body. The higher the reflectivity of the wafer or its coatings, the greater the number of reflections required to achieve the same approximation to black body characteristics. This can be achieved with a steeper angle at which the pyrometer is aimed at the stack.

The above described and other objectives and advantages of the present invention will be more readily apparent from the following detailed description of the drawings in which:

DETAILED DESCRIPTION OF THE DRAWINGS

Figure 1:
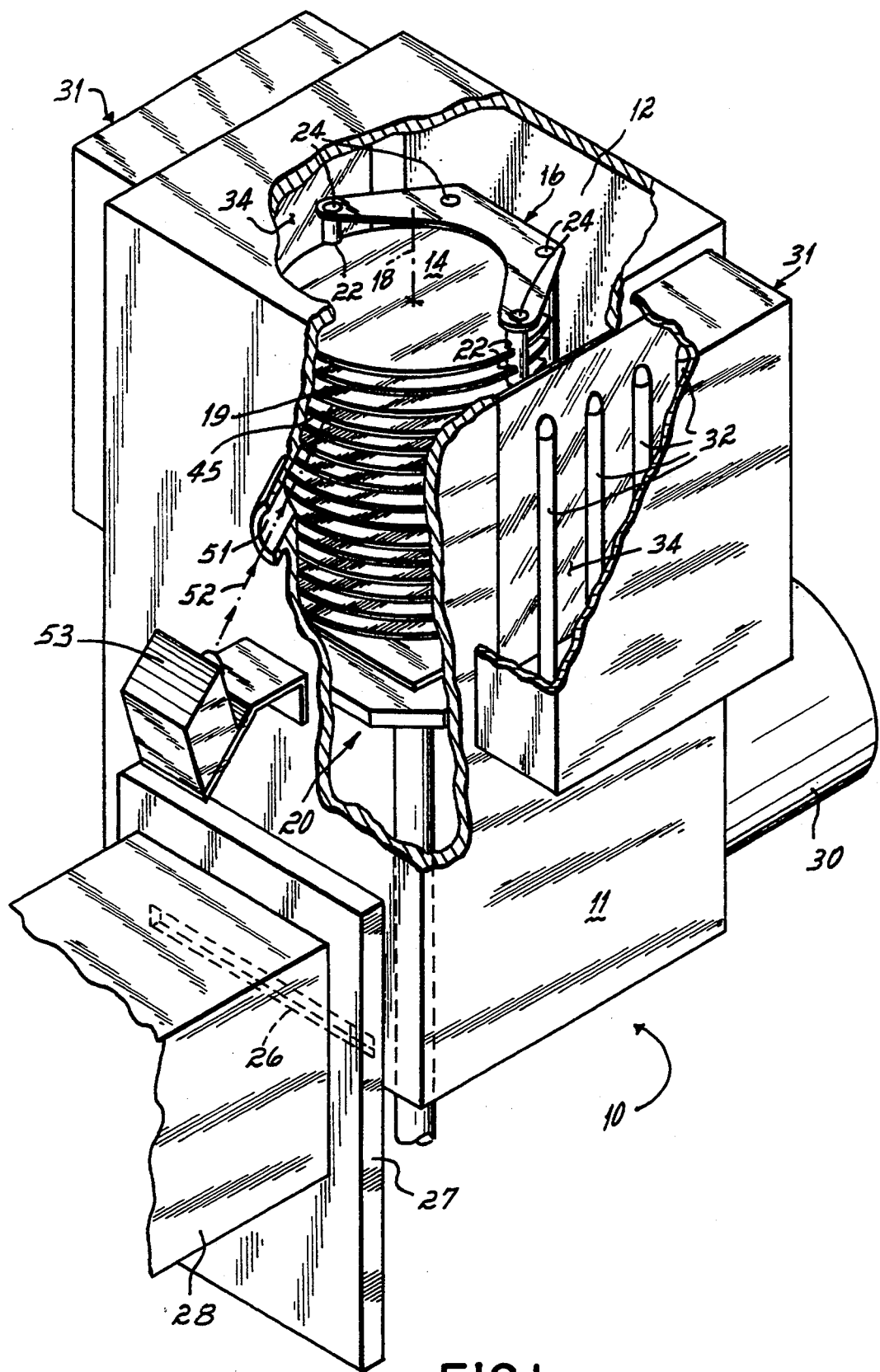
FIG. 1 is perspective view, partially cut away, of a portion of a degas module of a silicon wafer processing cluster tool apparatus embodying principles of the present invention.

Referring to FIG. 1, one embodiment of the present invention is illustrated in a semiconductor wafer batch preheating module 10 of a semiconductor wafer processing cluster tool, such as that disclosed in commonly assigned and co-pending U.S. Pat. application Ser. No. 07/701,800, filed May 17, 1991, entitled "Wafer Processing Cluster Tool Batch Preheating and Degassing Method and Apparatus", hereby expressly incorporated herein by reference. The module 10 includes a sealed housing 11 enclosing a vacuum chamber 12 in which wafers 14 are processed. In the illustrated embodiment of the module 10, the process performed is one of preheating or preconditioning the wafers 14 for the purpose of removing absorbed gases and vapors prior to the processing of the wafers in other modules of the semiconductor wafer processing apparatus.

In the module 10, the wafers 14 are supported in a multiple wafer support or rack 16 on which they are vertically stacked. The wafers 14 are typically circular, thin flat plates or planar disks of approximately 0.75 millimeters in thickness and 150 millimeters, 200 millimeters or more in diameter. When stacked on the rack 16, each of the wafers 14 lies in a horizontal plane and is spaced from and aligned with the adjacent wafers on the stack 19 on a vertical axis 18.

The rack 16 is supported in the chamber 12 on a vertically movable and rotatable elevator 20. The rack 16 has a plurality of wafer holders formed by a plurality of slots 22 in four vertical quartz rods 24. The wafers 14 are individually loaded into the rack 16 as the elevator 20 is vertically indexed to bring each of the slots 22 successively into alignment with a wafer loading port 26 in the housing 12. The port 26 sealably communicates between the vacuum chamber 12 inside of the housing 11 and the interior vacuum chamber of a wafer transport module 28, which has supported in it a robotic wafer handling mechanism (not shown) for transferring wafers to and from the degassing chamber 12 of the module 10 and to and from other processing modules of the wafer processing apparatus. The vacuum in the chamber 12 is maintained by conventional cryogenic vacuum pumps 30 connected to the chamber 12 through the housing 11.

In a typical heat treatment process such as the batch preheating process performed with the module 10, wafers 14 are individually loaded through the open gate valve 26 and into the slots or holders 22 of the rack 16 as the elevator 20 is indexed past the port 26. Then, the gate valve 27 is closed with the vacuuming chamber 12 at the same pressure level as that in the chamber of the transport module 28.

In the preheating or degassing process, the pressure in the chamber 12 may be changed to a pressure different from that of the transport module 28 or maintained at the same pressure through operation of the pump assembly 30. In the process, the wafers 14, which are stacked on the rack 16 in the sealed chamber 12, are uniformly brought to an elevated temperature by the energizing of radiant heaters 31 having lamps 32 arranged in sets on the outside of the chamber 12, behind quartz windows 34 in opposed walls of the housing 11. This elevated or processing temperature, which may be, for example, 500° C., is usually maintained for some predetermined processing time of, for example, fifteen minutes, during which time the temperature must be monitored and controlled.

Figure 2:
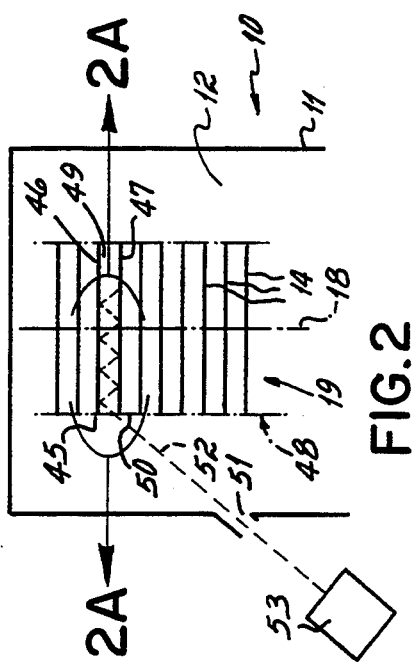
FIG. 2 is an side elevational diagram, partially cut away, of the embodiment of FIG. 1.
Figure 2A:
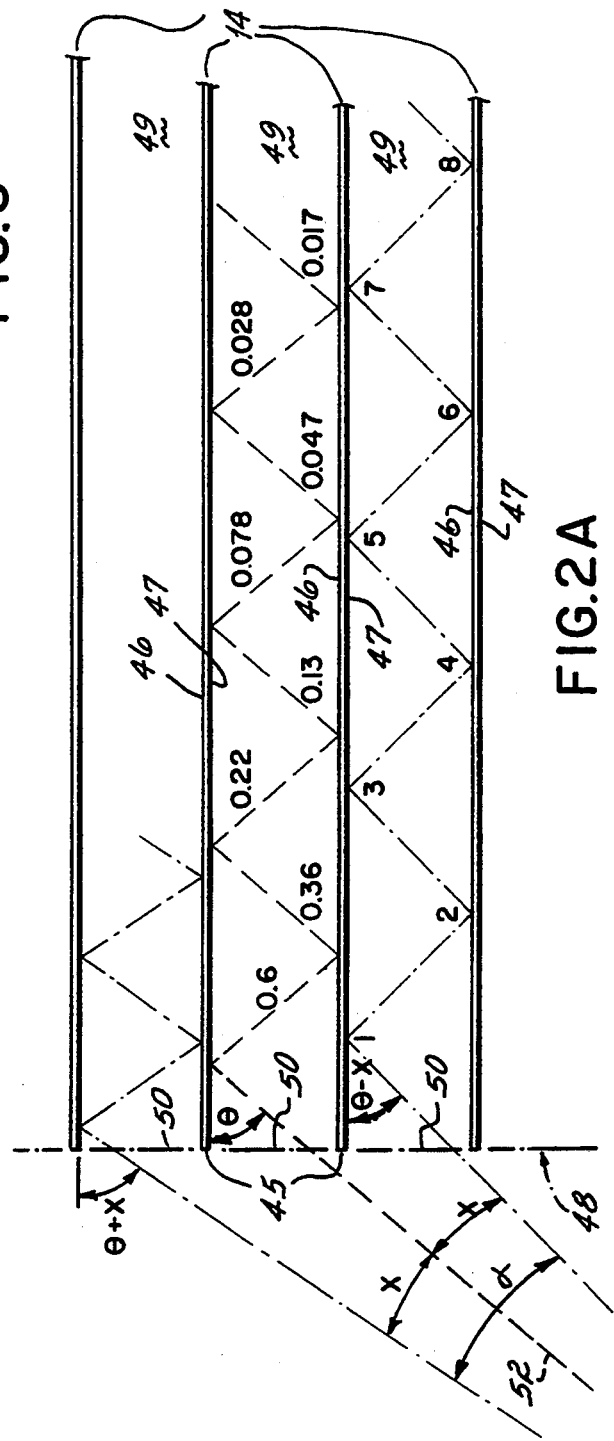
FIG. 2A is an enlarged diagrammatic view of the encircled area 2A—2A of FIG. 2.

Accordingly to the preferred embodiment of the present invention, at the front of the housing 11 there is provided a view port or window 51 positioned slightly above the lower portion of the rack 16 when the elevator 20 is in the elevated or processing position. The view port 51 is preferably inclined upwardly at an angle $\theta$, preferably equal to of approximately 40°, to the horizontal, as is better illustrated by referring to FIG. 2A in conjunction with the reference to FIG. 1. The view port 51 is positioned and oriented such that its center line 52 is directed approximately at the near side of the stack 19.

The wafers 14 of the stack 19 are generally circular, bounded by circular edges 45. They are, in the illustrated embodiment, each arranged with an upwardly facing frontside 46 and a downwardly facing backside 47. So arranged, the edges 45 lie on the surface of an imaginary cylinder 48 centered on the axis 18. The facing surfaces 46 and 47 of adjacent wafers 14 of the stack 19 are parallel and define spaces 49 between them. The spaces may be considered as surrounded by circular boundaries 50 lying on the cylinder 48.

Mounted outside of the chamber adjacent the window or view port 51, and aimed along an axis 52 thereof, is a pyrometer 53. The pyrometer 53 is aimed, either physically in a direct line or with the assistance of mirrors along a reflected path, through the view port 51 to receive energy from the side of the stack 19 from approximately three of the parallel spaces between adjacent wafers at the centermost portion of the stack. This is achieved by a field of view $\alpha$ of the pyrometer 53 of about 7° to include a disc of about 25 mm at about 200 mm from the stack, The fact that the energy received by the pyrometer 53 is somewhat independent of the emissivity of the wafers of the stack can be better appreciated by reference to FIGS. 2 and 2A.

By way of explanation, since the emissivity is equal to the absorptivity of the wafers 14, the pyrometer 53 may be viewed, rather as a receiver, as a light source. Accordingly, light emitted from the pyrometer/source 53 along the axis 52 will impinge at a point on the backside surface of the central wafer of the stack. This beam along the axis 52 will impinge at an angle $\theta$ of, say 40°, onto the backside 47 surface of a first and preferably central one of the wafers 14, and then be reflected at a similar angle $\theta$ from the backside surface 47 of that wafer 14 to impinge at a similar angle $\theta$ onto the frontside surface 46 of the next adjacent one of the wafers 14 below the central wafer. If the emissivity or absorptivity of the surface is, for example, 40%, the amount of the incident energy reflected at this next wafer may be considered to be approximately 60% of the energy incident upon the first wafer. Since those wafers 14 that lie in the field of view $\alpha$ are separated from the ends of the stack 19 by one or preferably several other similar wafers that are at the same temperature, the amount of energy transmitted in both directions through the wafers 14 at the center of the stack 19 is approximately equal and may be ignored.

The beam reflected from the upper or front surface of the wafer immediately below the central wafer at the same angle $\theta$, will be further reflected if the emissivity of this surface is similarly 40%, the amount of reflected energy will be 60% of the energy incident upon it, or 36% of the total initial energy impinging along the beam axis 52. Further reflections will continue to reduce the amount of the original energy reflected to 60% of that incident at each reflection point. Accordingly, when the diameter of the wafer is about four times the spacing between the two wafers, with the angle of incidence initially at 40°, approximately eight reflections will take place. In the third through the eighth reflections, the amount of original energy reflected will be at 22%, 13%, 7.8%, 4.7%, 2.8%, and ultimately 1.7%. Accordingly, 98.3% of the initially incident energy will have been absorbed by the two wafers. This 40% emissivity is typical of bare silicone wafers.

Accordingly, when the stack of wafers is heated to a given temperature, the energy emitted from the surfaces is reflected from the surface of the adjacent wafer and after several reflections passes beyond the edge of the wafer, some along the axis 52 of the pyrometer 53, to be read by the pyrometer 53. Such reflective energy will be, in the case of the example above, 98.3% of the energy that would be admitted if the emissivity of the wafers in the stack 19 were 1.0, or were equal to that of a theoretical "black body". With the emissivity of a material at 10%, as might be typical of aluminum coated wafers, the incident light on the pyrometer 53 will be greater than 95% of that of the radiation from a black body (for eight reflections used in the example above). In such an example, wafers with the emissivity 60% or greater will appear to emit energy at over 99% of that of a black body. Similarly, variations in the emissivity of the upper and lower surfaces of different points on the surface will be rendered insignificant by the large number of reflections that a beam would travel from one side of a wafer to the other before impinging on the pyrometer 53. With 150 mm wafers spaced 9 mm apart, with $\theta=40°$, more than twenty reflections will occur, so even highly reflective wafers will appear as black bodies to the pyrometer 53.

Figure 3:
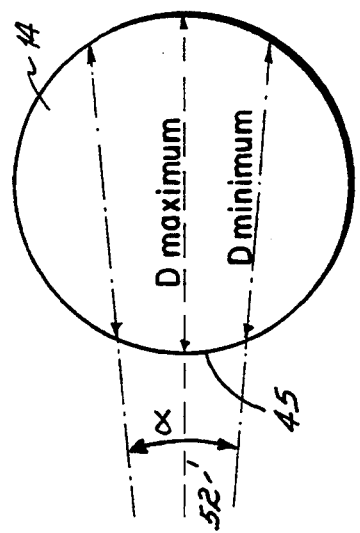
FIG. 3 is a top view of a portion of the diagram of FIG. 2.

For example, where the goal is to approximate a black body with wafers that may be coated and highly reflective, the analysis is straightforward. In the case where the wafers are bare on the backsides and coated with a reflective metal on the frontsides, the reflectivity of the wafer frontsides may be approximately 90%. In such a case, approximately fourteen reflections will be required to bring the energy incident upon the pyrometer to 98% of a black body. With wafers coated with metal on both sides, approximately twenty reflections are required. In any event, with 150 millimeter wafers spaced 9 millimeters apart, an angle $\theta$ of 40° will provide the acceptable number of reflections. This angle should be achieved not just along the centerline or line-of-site of the pyrometer, but for the shallowest angle of energy incident at any angle within the field-of-view, which may be defined as an angle $\alpha$ centered on the line-of-site of the pyrometer. Thus, the minimum angle of the line-of site of the pyrometer to the planes of the wafers may be estimated by the equation:

$$\theta = \tan^{-1}(R \cdot S/D) + \alpha/2$$

where R equals the number of reflections desired, S equals the spacing between wafers, and D equals the diameter of the wafers. More generally, the dimension D is the minimum dimension that may be defined by the length parallel to the wafers of a portion, that lies in the space between two wafers toward which the pyrometer is directed, of any plane that is perpendicular to the wafers that contains a path of energy incident upon the pyrometer within its field-of-view as shown in FIG. 3.

From the above, it will be apparent to one skilled in the art that various alternatives to the embodiments described may be employed without departing from the principles of the invention.

Accordingly, what is claimed is:

1. A method of measuring the temperature of a plurality of N wafers, $N \geq 4$, each having a diameter D, a thickness T and bounded by an edge, the wafers being aligned on an axis and spaced a distance S from each other and lying in a stack in parallel planes perpendicular to the axis, the edges of the wafers lying on the surface of a cylinder centered about the axis, the planes defining N-1 spaces between adjacent ones thereof having a boundary lying on the surface of the cylinder, the stack being contained in a sealed processing chamber, surrounded by a chamber wall, of a semiconductor wafer processing apparatus, the method comprising the steps of:

providing a pyrometer outside of the chamber, the pyrometer having a line-of-sight extending therefrom and a field-of-view spanning an angle $\theta$ centered on the line-of-sight, the pyrometer being responsive to radiant thermal energy impinging thereon at an angle that is within the field-of-view about the line-of-sight;

directing the pyrometer through a window in the wall of the chamber toward a side of the stack and generally toward the axis with the line-of-sight at an angle $\theta$ to the planes;

the pyrometer being directed such that, and the angle $\alpha$ being such that, the field-of-view includes the boundary of at least one of the spaces and excludes the boundaries of the 1st and (N-1)th spaces;

wherein $\tan^{-1}(R \cdot S/D) + \alpha/ \leq \theta < 90° - /2$, where R equals at least 5; and producing, in response to energy incident upon the pyrometer so directed, a signal representative of the temperature of the wafers of the stack.

2. The method of claim 1 in which the wafers each have a partially processed front side and an unprocessed back side, and are arranged in a stack with the front sides thereof facing in a common axial direction, wherein:

the pyrometer directing step further comprises directing the pyrometer with the line-of-sight toward the back sides of the wafers at the angle $C\theta$ to the planes.

3. The method of claim 2 wherein R is greater than or equal to approximately 14.

4. The method of claim 3 wherein $N \geq 7$ and the field of view excludes the boundaries of at least the 1st, 2nd, (N-1)th and (N-2)th spaces.

5. The method of claim 1 wherein $N \geq 6$ and the field of view excludes the boundaries of at least the 1st, 2nd, (N-1)th and (N-2)th spaces.

6. The method of claim 1 wherein $N \geq 5$ and the field of view includes the boundaries of at least two spaces.

7. The method of claim 1 further comprising:
controlling the temperature of the wafers in the stack in response to the produced signal.

8. A method of measuring the temperature of a plurality of wafers stacked in parallel spaced relationship in a processing chamber of a wafer batch processing apparatus, the plurality of wafers including a pair of end wafers on opposite ends of the stack and a plurality of central wafers positioned therebetween, the method comprising the steps of:

directing a directional pyrometer toward a side of the stack with a field-of-view limited to include only central wafers of the stack and spaces therebetween;

inclining the pyrometer to receive energy from the stack at an acute angle to the wafers that is sufficiently large to insure that substantially all of the energy incident upon the pyrometer from the stack includes substantially only energy emitted from the wafers, transmitted through the wafers, and reflected alternately from the facing sides adjacent ones of the wafers a sufficient number of times such that the total energy received by the pyrometer approximates that emitted from a theoretical black body having an emissivity of 1.0 and of the same temperature; and producing, in response to energy incident upon the pyrometer, a signal representative of the temperature of the wafers of the stack.

9. The method of claim 8 further comprising:

controlling the temperature of the wafers in the stack in response to the produced signal.

* * * * *

UNITED STATES PATENT AND TRADEMARK OFFICE
CERTIFICATE OF CORRECTION

PATENT NO. : 5,352,248
DATED : October 4, 1994
INVENTOR(S) : Ishikawa, et al.

It is certified that error appears in the above-indentified patent and that said Letters Patent is hereby corrected as shown below:

On title page, item [54] and column 1, line 3, in the title "ON" should be --IN--.

In the claims:

Col. 8, line 9, "angle $\theta$" should be --angle $a$--.

Col. 8, line 22, "$\tan^{-1}(R \cdot S/D) + a/\leq \theta < 90°-/2$," should be as follows:

--$\tan^{-1}(R \cdot S/D) + a/2 \leq \theta < 90° - a/2$--.

Signed and Sealed this

Twenty-ninth Day of August, 1995

Attest:

BRUCE LEHMAN

*Attesting Officer*     *Commissioner of Patents and Trademarks*